US012640348B2

(12) United States Patent
Luo et al.

(10) Patent No.: US 12,640,348 B2
(45) Date of Patent: May 26, 2026

(54) PULSING REMOTE PLASMA FOR ION DAMAGE REDUCTION AND ETCH UNIFORMITY IMPROVEMENT

(71) Applicant: LAM RESEARCH CORPORATION, Fremont, CA (US)

(72) Inventors: Wei Yi Luo, Fremont, CA (US); Chih-Hsun Hsu, Cupertino, CA (US); Huai-Suen Shiau, Fremont, CA (US); Tianqi Wang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 482 days.

(21) Appl. No.: 18/008,761

(22) PCT Filed: Jun. 11, 2021

(86) PCT No.: PCT/US2021/036928
§ 371 (c)(1),
(2) Date: Dec. 7, 2022

(87) PCT Pub. No.: WO2021/252839
PCT Pub. Date: Dec. 16, 2021

(65) Prior Publication Data
US 2023/0223237 A1     Jul. 13, 2023

Related U.S. Application Data

(60) Provisional application No. 63/038,723, filed on Jun. 12, 2020.

(51) Int. Cl.
H01J 37/32 (2006.01)
H10P 50/24 (2026.01)

(52) U.S. Cl.
CPC ...... H01J 37/32357 (2013.01); H01J 37/321 (2013.01); H01J 37/32146 (2013.01);
(Continued)

(58) Field of Classification Search
None
See application file for complete search history.

(56) References Cited

U.S. PATENT DOCUMENTS

2003/0089680 A1* 5/2003 Johnson .................... G03F 1/80
216/68
2014/0062303 A1 3/2014 Hoffman et al.
(Continued)

FOREIGN PATENT DOCUMENTS

KR        20130085955 A    7/2013
KR        1020150087702 A    7/2015
(Continued)

OTHER PUBLICATIONS

International Search Report and Written Opinion of the ISA issued in PCT/US2021/036928, mailed Oct. 5, 2021, ISA/KR.
(Continued)

*Primary Examiner* — Roberts P Culbert

(57) ABSTRACT

A method of performing pulsed remote plasma etching includes arranging a substrate in a processing chamber configured to perform pulsed remote plasma etching, setting at least one process parameter of the processing chamber, supplying at least one gas mixture to an upper chamber region of the processing chamber, supplying, in an ON period, a first voltage to coils arranged around the upper chamber region to energize the at least one gas mixture and generate plasma within the upper chamber region of the processing chamber, turning off the first voltage in an OFF period to discontinue generating plasma within the upper chamber region of the processing chamber, and alternating between supplying the first voltage in the ON period and turning off the first voltage in the OFF period to generate pulsed remote plasma within the upper chamber region of the processing chamber.

11 Claims, 5 Drawing Sheets

(52) U.S. Cl.
CPC .. *H01J 37/32449* (2013.01); *H01J 37/32495* (2013.01); *H10P 50/242* (2026.01); *H01J 2237/3343* (2013.01)

(56) References Cited

U.S. PATENT DOCUMENTS

| | | | |
|---|---|---|---|
| 2015/0206716 A1* | 7/2015 | Kim et al. | |
| 2016/0172216 A1* | 6/2016 | Marakhtanov .... | H01J 37/32174 |
| 2018/0174870 A1 | 6/2018 | Yang et al. | |
| 2018/0226227 A1 | 8/2018 | Donnelly et al. | |
| 2018/0358205 A1 | 12/2018 | Long et al. | |
| 2021/0358716 A1* | 11/2021 | Kim ................... | H01L 21/3065 |

FOREIGN PATENT DOCUMENTS

| | | |
|---|---|---|
| KR | 20180025268 A | 3/2018 |
| TW | 202018782 A | 5/2020 |
| WO | WO-03-036704 A1 | 5/2003 |

OTHER PUBLICATIONS

Taiwanese Office Action from Corresponding Application No. 110121349, dated Dec. 9, 2024.

Office Action Received for related KR App. No. 10-2023-7000613 dated Jun. 12, 2025.

Office Action received for related KR App. No. 10-2023-7000613 dated Feb. 23, 2026.

* cited by examiner

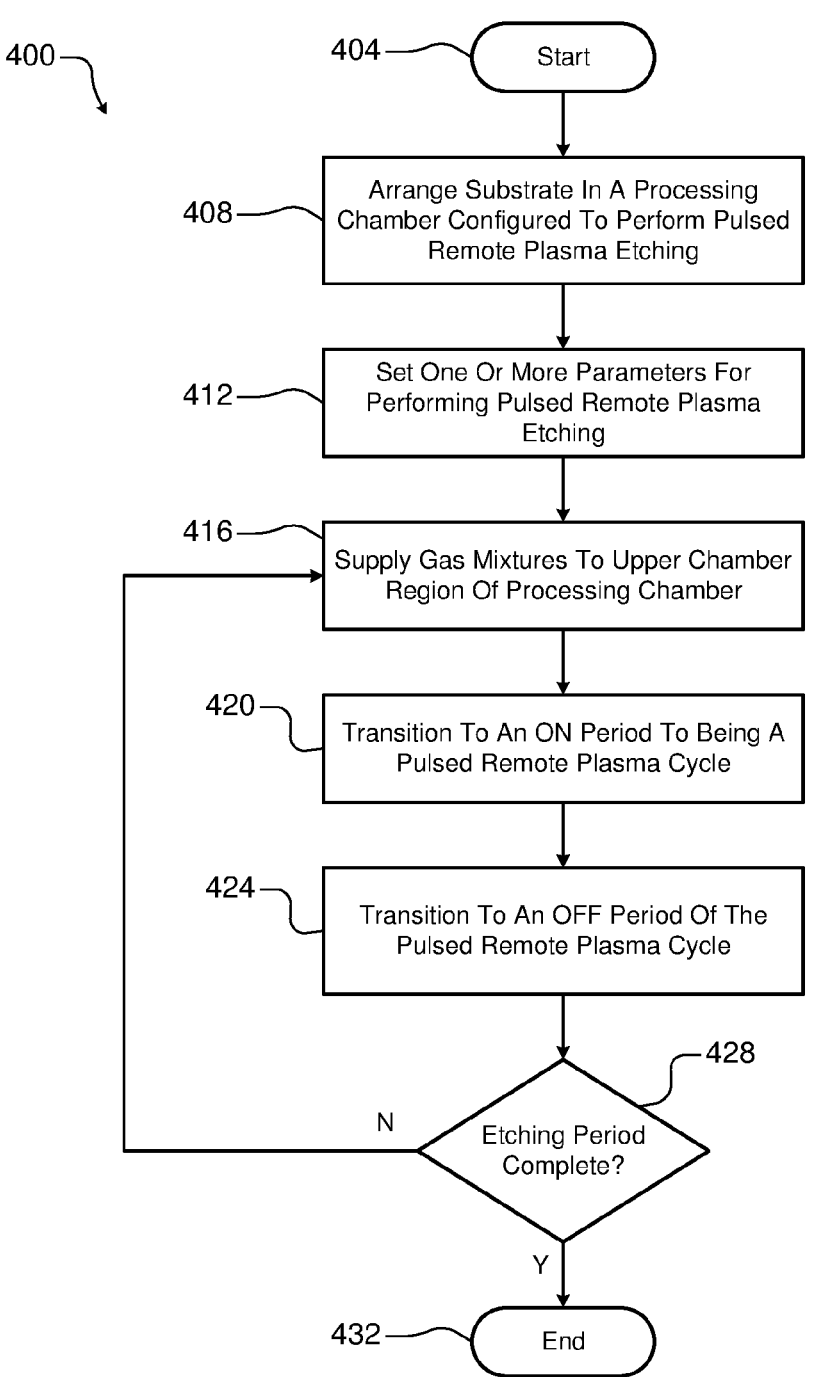

400

404 — Start

408 — Arrange Substrate In A Processing Chamber Configured To Perform Pulsed Remote Plasma Etching 412 — Set One Or More Parameters For Performing Pulsed Remote Plasma Etching 416 — Supply Gas Mixtures To Upper Chamber Region Of Processing Chamber 420 — Transition To An ON Period To Being A Pulsed Remote Plasma Cycle 424 — Transition To An OFF Period Of The Pulsed Remote Plasma Cycle

428

N

Etching Period Complete?

Y

432 — End

FIG. 4

PULSING REMOTE PLASMA FOR ION DAMAGE REDUCTION AND ETCH UNIFORMITY IMPROVEMENT

CROSS-REFERENCE TO RELATED APPLICATIONS

This application is a U.S. National Phase Application under 35 U.S.C. 371 of International Application No. PCT/US2021/036928, filed on Jun. 11, 2021, which claims the benefit of U.S. Provisional Application No. 63/038,723, filed on Jun. 12, 2020. The entire disclosures of the applications referenced above is are incorporated herein by reference.

FIELD

The present disclosure relates improved processing of substrates in remote plasma source substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform treatments on substrates such as semiconductor wafers. Examples of the treatments include deposition, etching, cleaning, etc. The substrate processing systems typically include a processing chamber including a substrate support, a gas delivery system and a plasma generator.

During processing, the substrate is arranged on the substrate support. Different gas mixtures may be introduced by the gas delivery system into the processing chamber. In some applications, radio frequency (RF) plasma such as inductively coupled plasma (ICP) may be used to activate chemical reactions.

ICP produces both highly reactive neutral species and ions to modify wafer surfaces. As customer devices become increasingly complicated and sensitive, controlling exposure of the substrate to the plasma is increasingly important. Ions generated within the plasma can have damaging effects on sensitive materials within device structures. The ions can modify the properties of device materials and adversely affect the performance of the overall structure.

SUMMARY

A method of performing pulsed remote plasma etching includes arranging a substrate in a processing chamber configured to perform pulsed remote plasma etching, setting at least one process parameter of the processing chamber, supplying at least one gas mixture to an upper chamber region of the processing chamber, supplying, in an ON period, a first voltage to coils arranged around the upper chamber region to energize the at least one gas mixture and generate plasma within the upper chamber region of the processing chamber, turning off the first voltage in an OFF period to discontinue generating plasma within the upper chamber region of the processing chamber, and alternating between supplying the first voltage in the ON period and turning off the first voltage in the OFF period to generate pulsed remote plasma within the upper chamber region of the processing chamber.

In other features, the method further includes supplying a second voltage to the coils in the ON period. Ion energy distribution is less in the OFF period than in the ON period. The method further includes setting a duration of the OFF period based on a desired ion energy distribution. The method further includes setting a duration of the OFF period based on a lifetime of ions associated with the plasma generated within the upper chamber region. The duration of the OFF period is greater than the lifetime of the ions. The duration of the OFF period is less than a lifetime of radicals associated with the plasma generated within the upper chamber region. The duration of the OFF period is between 0.1 ms and 8.0 ms. A duty cycle of the ON and OFF periods is between 10% and 90%.

A method of performing pulsed remote plasma etching includes arranging a substrate in a processing chamber configured to perform pulsed remote plasma etching, setting at least one process parameter of the processing chamber, supplying at least one gas mixture to an upper chamber region of the processing chamber, supplying, in a first period, a first voltage to coils arranged around the upper chamber region to energize the at least one gas mixture and generate plasma within the upper chamber region of the processing chamber, supplying, in a second period, a second voltage to the coils, and alternating between supplying the first voltage and the second voltage to generate pulsed remote plasma within the upper chamber region of the processing chamber.

In other features, ion energy distribution is less in the second period than in the first period. The method further includes setting a duration of the second period based on a lifetime of ions associated with the plasma generated within the upper chamber region.

A system for performing pulsed remote plasma etching includes a processing chamber configured to perform pulsed remote plasma etching. The processing chamber includes an upper chamber region and a lower chamber region. A controller is configured to control a gas delivery system to supply at least one gas mixture to the upper chamber region of the processing chamber and control a plasma generator to supply, in an ON period, a first voltage to coils arranged around the upper chamber region to energize the at least one gas mixture and generate plasma within the upper chamber region of the processing chamber, turn off the first voltage in an OFF period to discontinue generating plasma within the upper chamber region of the processing chamber, and alternate between supplying the first voltage in the ON period and turning off the first voltage in the OFF period to generate pulsed remote plasma within the upper chamber region of the processing chamber.

In other features, the controller is configured to supply a second voltage to the coils in the ON period. Ion energy distribution is less in the OFF period than in the ON period. The controller is configured to set a duration of the OFF period based on a desired ion energy distribution. The controller is configured to set a duration of the OFF period based on a lifetime of ions associated with the plasma generated within the upper chamber region. The duration of the OFF period is greater than the lifetime of the ions. The duration of the OFF period is less than a lifetime of radicals associated with the plasma generated within the upper chamber region. The duration of the OFF period is between 0.1 ms and 8.0 ms. A duty cycle of the ON and OFF periods is between 10% and 90%.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 shows steps of an example method for performing pulsed remote plasma etching according to the present disclosure.

In the drawings, reference numbers may be reused to identify similar and/or identical elements.

DETAILED DESCRIPTION

Figure 1:
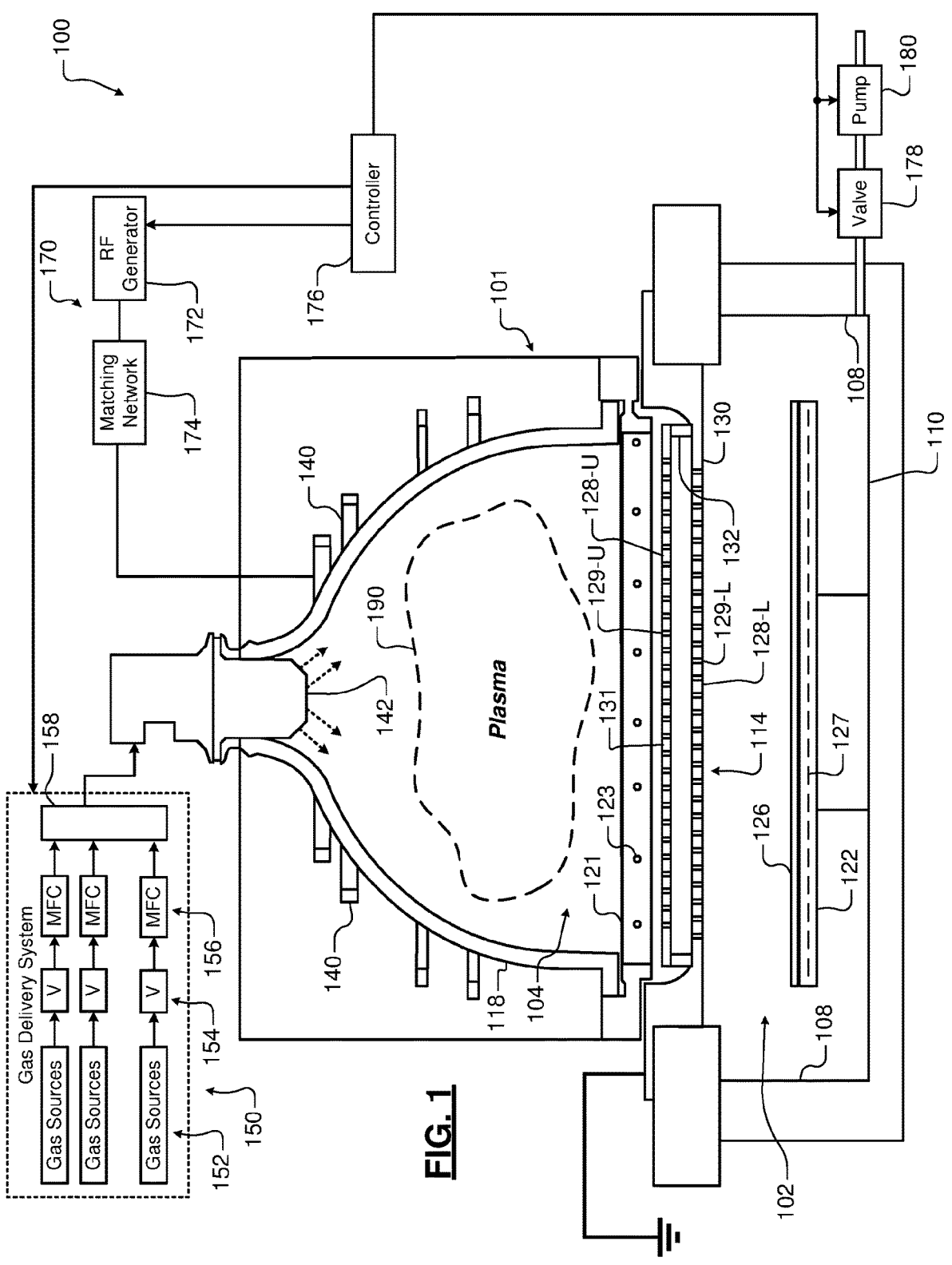
FIG. 1 is a functional block diagram of an example substrate processing system according to the present disclosure.

Some substrate processing systems are configured to generate plasma remotely (i.e., in a location external to a processing chamber). Remote plasma substrate processing systems include a distribution device such as showerhead assembly arranged between an upper region of a processing chamber where plasma is generated and a lower region of the processing chamber where a substrate is located. The showerhead assembly may be configured to function as a filter (e.g., a dual ion filter) for blocking or filtering ions and/or ultraviolet (UV) light. For example, the showerhead assembly may comprise a single piece or upper and lower plates (e.g., upper and lower filters). The upper plate or filter may be configured to primarily filter ions generated by the plasma. Conversely, the lower filter may be configured to primarily control plasma uniformity.

The showerhead assembly reduces a number of ions reaching the substrate by increasing an electrically grounded area to capture ions, increasing surface area to help recombination, and decreasing a mean free path to facilitate recombination. For example, surfaces of the showerhead assembly are configured as one or more grids that eliminate line of sight between a plasma source and the substrate. However, the showerhead assembly does not prevent all ions from reaching the substrate. Ions reaching the substrate cause ion charge damage on surfaces of the substrate and increase etch rate non-uniformities. For example, ions increase a height of a center region in a "W" shape (i.e., with respect to a radial distance across a substrate) of the etch rate.

Typically, remote plasma substrate processing systems generate continuous wave plasma. Systems and methods according to the present disclosure implement a pulsed remote plasma source to reduce ion charge damage and etch rate non-uniformities. For example, using pulsed remote plasma reduces the height of the "W" shape of the etch rate (i.e., flattens the "W" shape to improve etch rate uniformity in a center region of the substrate). Pulsing frequency and duty cycles may be varied to minimize reflected power and achieve desired plasma performance. In one example, pulsing the remote plasma includes plasma generating cycles that alternate between an OFF period and an ON period where a single RF power level is provided. In another example, pulsing the remote plasma includes alternating between two different RF power levels in respective ON periods. In another example, pulsing the remote plasma includes alternating between an OFF period and different RF power levels in respective ON periods. Further examples may include other ON and OFF period patterns and multiple RF power levels.

During OFF periods of the pulsed plasma generating cycles, electron temperature $(T_e)$ decreases, which causes ions to impact the substrate surface with reduced energy relative to ions in continuous wave remote plasma generation. Further, a charging effect on the substrate surface decrease, dissociation decreases, and ion density on the substrate surface decreases during the OFF periods, which increases $O_x$ etching selectivity. Conversely, while ion lifetime decreases (e.g., to less than 1.0 ms, such as 0.1 ms), radical lifetime is maintained (e.g., at 8-12 ms). Accordingly, a desired radical density may be maintained while ion density is reduced.

Referring now to FIG. 1, a substrate processing system 100 includes a substrate processing chamber 101. Although the substrate processing chamber 101 is shown as an inductively coupled plasma (ICP) based system, the examples disclosed herein may be applied to other types of substrate processing systems such as transformer coupled plasma (TCP) or downstream plasma systems.

The substrate processing chamber 101 includes a lower chamber region 102 and an upper chamber region 104. The lower chamber region 102 is defined by chamber sidewall surfaces 108, a chamber bottom surface 110, and a lower surface of a gas or plasma distribution device such as a showerhead assembly including a showerhead 114. For example, the showerhead 114 may be configured to function as a dual ion and/or UV filter/blocker.

The upper chamber region 104 is defined by an upper surface of the showerhead 114 and an inner surface of a dome 118. In some examples, the dome 118 rests on a first annular support 121 including one or more spaced holes 123 for delivering process gas to the upper chamber region 104. In some examples, the process gas is delivered by the one or more spaced holes 123 in an upward direction at an acute angle relative to a plane including the showerhead 114, although other angles/directions may be used. A gas flow channel in the first annular support 121 may be used to supply gas to the one or more spaced holes 123.

The substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during processing such as etching. In some examples, a temperature of the substrate 126 may be controlled by heating elements (or a heater plate) 127, an optional cooling plate with fluid channels and one or more sensors (not shown), although any other suitable substrate support temperature control system may be used.

In some examples, the showerhead 114 includes a lower plate 128-L with $N_1$ through holes 129-L. The showerhead 114 includes an upper plate 128-U with $N_2$ through holes 129-U. In some examples, the lower and upper plates 128-L and 128-U include planar portions 130 and 131, respectively, that are arranged parallel to one another. In some examples, the lower and upper plates 128-L and 128-U are connected to a reference potential such as ground (as shown in FIG. 1). In other examples, the lower and upper plates 128-L and 128-U may be connected to a positive or negative DC reference potential. The upper and lower plates 128-U and 128-L can be biased by the same reference potential or different reference potentials. Components of the shower-head 114 including, but not limited to, the upper and lower plates 128-U and 128-L include a coating in accordance with the principles of the present disclosure as described below in more detail.

The upper plate 128-U may be supported above the lower plate 128-L by an annular ring 132 (or supported in a similar spaced relationship in another manner). Alternately, the lower plate 128-L may be supported below the upper plate 128-U by the annular ring 132 (or supported in a similar spaced relationship in another manner). In still other examples, the upper plate 128-U and the lower plate 128-L are independently supported by chamber walls or one or more other processing chamber components in a spaced relationship.

One or more inductive coils 140 may be arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150. The gas delivery system 150 includes one or more gas sources 152, one or more valves 154, one or more mass flow controllers (MFCs) 156, and a mixing manifold 158, although other types of gas delivery systems may be used.

In some examples, the gas injector 142 includes a center injection location that directs gas in a downward direction and one or more side injection locations that inject gas at one or more angles with respect to the downward direction. In some examples, the gas delivery system 150 delivers a first portion of the gas mixture at a first flow rate to the center injection location and a second portion of the gas mixture at a second flow rate to the side injection locations of the gas injector 142. In other examples, different gas mixtures are delivered by the gas injector 142. In some examples, the gas delivery system 150 delivers tuning gas to other locations in the processing chamber.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. Although a single RF source (i.e., RF generator 172) is shown, in other examples multiple RF sources may be used to supply two or more different pulsing levels. A valve 178 and a pump 180 may be used to control pressure inside of the lower and upper chamber regions 102, 104 and to evacuate reactants.

A controller 176 communicates with the gas delivery system 150, the valve 178, the pump 180, and/or the plasma generator 170 to control flow of process gas, purge gas, RF plasma and chamber pressure. The controller 176 according to the present disclosure is configured to control the plasma generator 170 to generate pulsed remote plasma as described below in more detail. In some examples, plasma is sustained inside the dome 118 by the one or more inductive coils 140. One or more gas mixtures are introduced from a top portion of the substrate processing chamber 101 using the gas injector 142 (and/or holes 123).

Figure 2:
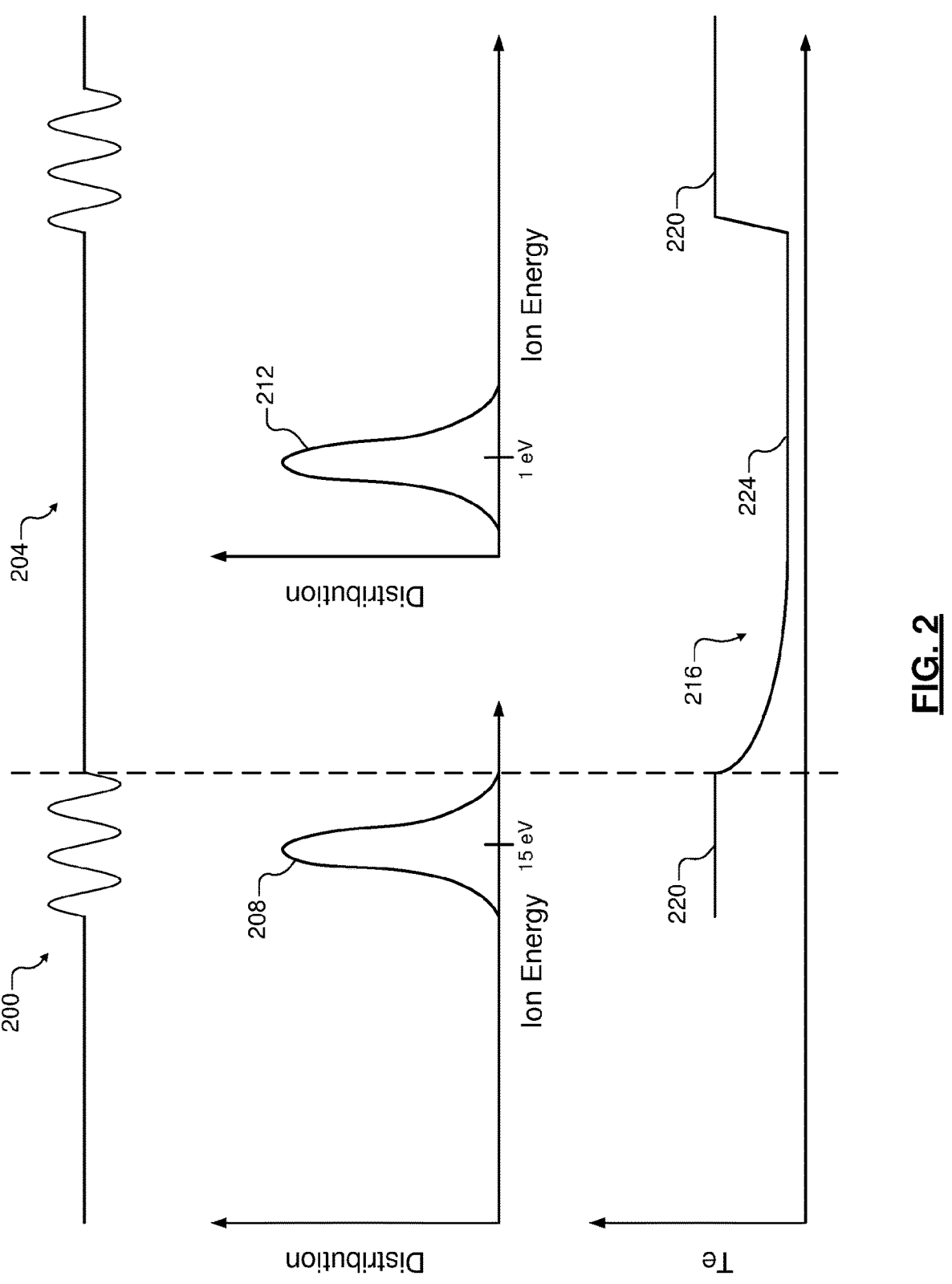
FIG. 2 shows example ion energy distribution and electron temperature $T_e$ for RF plasma ON and OFF periods of a pulsed remote plasma cycle according to the present disclosure.

Referring now to FIG. 2, example ion energy distribution and electron temperature $T_e$ are shown for RF plasma ON and OFF periods of a pulsed remote plasma cycle. In this example, pulsed remote plasma is supplied in alternating ON periods 200 and OFF periods 204 (i.e., RF power is alternately turned ON and OFF). In the ON periods 200, RF power is supplied at a desired frequency. Example ion energy distribution during the ON periods 200 is shown at 208. Conversely, example ion energy distribution during the OFF periods 204 is shown at 212. The ion energy distribution 212 during the OFF periods 204 is significantly lower with respect to the ion energy distribution 208 during the ON periods 200. For example, the ion energy distribution 212 is distributed around 1 electron volt (eV) while the ion energy distribution 208 is distributed around 15 eV.

Pulsed remote plasma results in the decreased electron temperature during the OFF period. An example electron temperature $T_e$ during the pulsed remote plasma is shown at 216. During the ON periods 200, the electron temperature 216 reaches a first level 220. During the OFF periods 204, the electron temperature 216 decreases to a second level 224. The electron temperature 216 returns to the first level 220 when the pulsed plasma transitions from the OFF periods 204 to the ON periods 200.

Accordingly, pulsing the remote plasma as shown results in decreased ion energy and electron temperature during the OFF periods 204, which correspondingly reduces overall average ion energy and electron temperature during the pulsed remote plasma cycle and reduces damage to the substrate caused by plasma (i.e., a depth of a damage layer on the surface of the substrate is reduced). For example, during the OFF periods 204, low energy ions may be deflected from the surface of the substrate and negative ions are formed, a charging effect on the surface of the substrate caused by positive ions is reduced, and dissociation is reduced.

Conversely, pulsing the remote plasma does not reduce the density of radicals associated with etching so desired etch rates are maintained. For example, while pulsing the remote plasma decreases ion lifetime (e.g., to less than 1.0 ms, such as 0.1 ms), radical lifetime is maintained (e.g., at 8-12 ms). In some examples, OFF periods 204 may be selected such that ions disappear prior to a beginning of a next ON period 200. For example, if ion lifetime during the OFF periods 204 is 0.1 ms, then the OFF periods 204 may be greater than 0.1 ms (e.g., 0.2 to 1.0 ms).

Figure 3:
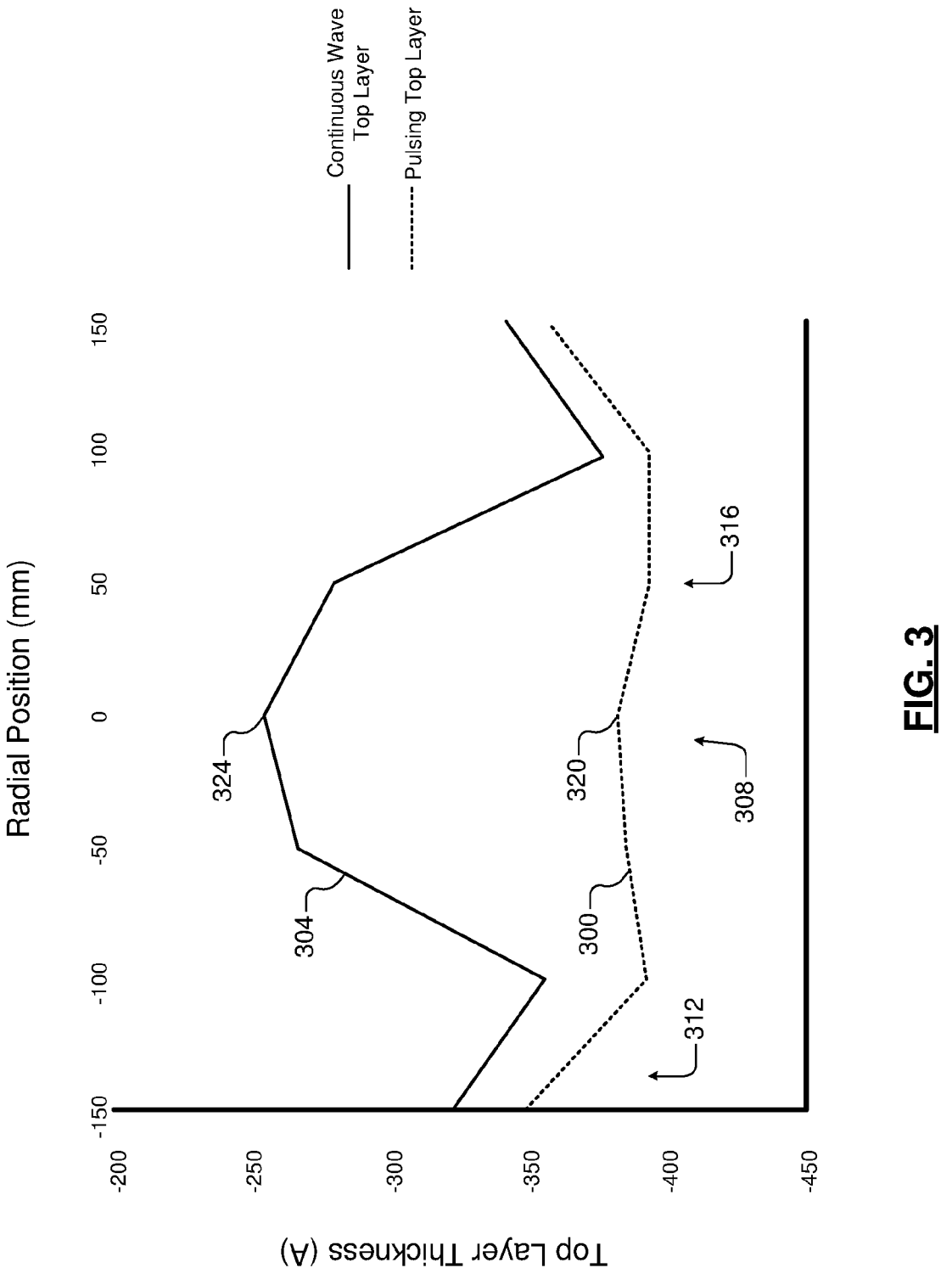
FIG. 3 shows an example etching profile for pulsed remote plasma according to the present disclosure.

Referring now to FIG. 3, an etching profile 300 for pulsed remote plasma according to the principles of the present disclosure and an etching profile 304 for continuous wave plasma are shown. The etching profiles 300 and 304 have a general "W" shape with respect to etch amounts (i.e., resulting from different etch rates) across a surface of the substrate. For example, the etching profiles 300 and 304 show etch amounts relative to a radial position on the surface of the substrate, where a center of the substrate is at 0 mm and outer edges of the substrate are at 150 mm. In other words, etch rates vary as a radial distance from a center of the substrate increases.

Charged ions reaching the substrate cause ion charge damage on surfaces of the substrate and increase etch rate non-uniformities. For example, ion charges increase a height of a center region in the "W" shape of the etching profiles 300 and 304. Accordingly, an etch amount (in angstroms A) in a center region 308 and an edge region 312 may be greater than etch amounts in an intermediate region 316 between the center region 308 and the edge region 312.

Pulsing the remote plasma according to the present disclosure reduces a center peak 320 of the "W" shape of the etching profile 300 (i.e., as compared to a center peak 324 of the etching profile 304). Accordingly, using pulsed remote plasma reduces the number of ions reaching the substrate and increases the recombination at the center area of the substrate to flatten the "W" shape of the etching profile 304 to improve etch rate uniformity in the center region 308 of the substrate.

Referring now to FIG. 4, an example method 400 for performing pulsed remote plasma etching according to the present disclosure begins at 404. At 408, a substrate is arranged in a processing chamber configured to generate remote plasma (e.g., the substrate processing chamber 101 as described above in FIG. 1). At 412, one or more processing parameters for performing pulsed remote plasma etching are set. For example, a pressure of the processing chamber is set between 1.0 and 1.5 Torr (e.g., at 1.4 Torr). At 416, one or more gas mixtures corresponding to a plasma species to be generated are supplied to an upper chamber region of the processing chamber (e.g., the upper chamber region 104). For example, the gas mixtures include argon and/or hydrogen to generate an argon-hydrogen plasma species.

At 420, the method 400 (e.g., the controller 176 and the RF generator 172) transitions to an ON period to begin a pulsed remote plasma cycle. For example, the method 400 supplies an RF voltage to energize coils (e.g., the coils 140) in the ON period to generate plasma within the upper chamber region 104, which flows into the lower chamber region 102 through the showerhead 114. In other words, the method 400 remotely generates the plasma in the upper chamber region 104.

During the ON period, the pulsed RF voltage is supplied at a pulsing frequency and a pulsing duty cycle configured to modulate ion energy to minimize ion charge damage and maintain desired levels of radicals associated with etching. For example, the RF voltage is supplied at a pulsing frequency between 100 Hz and 10,000 Hz and a pulsing duty cycle between 10% and 90%. The RF voltage is supplied at a power between 100 and 3000 W.

At 424, the method 400 transitions to an OFF period (i.e., the RF voltage is turned off). A duration of the OFF period may be selected such that ions substantially disappear during the OFF period. In other words, a duration of the OFF period may be selected based on an ion lifetime. For example, if ion lifetime is 0.1 ms, the OFF period may be greater than 0.1 ms. Conversely, the OFF period may be selected to be less than a radical lifetime to maintain desired radical levels. For example, if radical lifetime is 8-12 ms, the OFF period may be less than 8 ms. In one example, durations of the ON period and the OFF period may be the same (e.g., duty cycle may be 50%). In other examples, the duty cycle may be between 10% and 90%.

At 428, the method 400 determines whether to discontinue generating pulsed remote plasma. For example, the method 400 (e.g., the controller 176) determines whether an etching period is complete. If true, the method 400 ends at 432. If false, the method 400 continues to 420 to continue alternating ON and OFF periods in a pulsed remote plasma cycle.

Figures 5A, 5B, 5C:
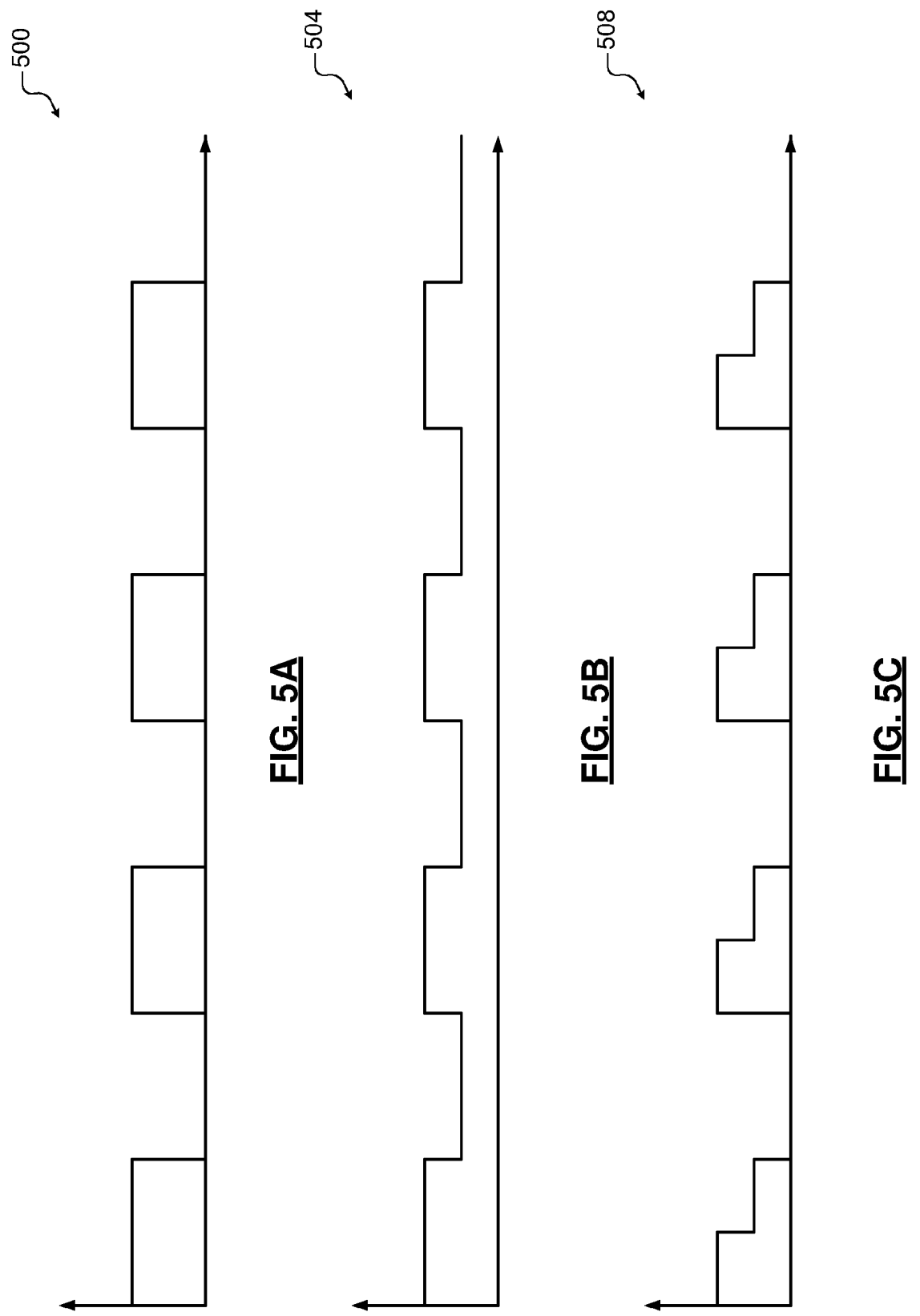
FIGS. 5A, 5B, and 5C show example pulsed remote plasma cycles according to the present disclosure.

FIGS. 5A, 5B, and 5C show example pulsed remote plasma cycles 500, 504, and 508 according to the present disclosure. As shown in FIG. 5A, the pulsed remote plasma cycle 500 includes alternating ON and OFF periods as described above in FIG. 4. For example, the cycle 500 alternates between supplying a single RF voltage level in the ON period and not supplying any RF voltage in the OFF period.

As shown in FIG. 5B, the pulsed remote plasma cycle 504 includes alternating RF voltage levels in respective ON periods. For example, the cycle alternates between supplying a first non-zero RF voltage level in a first ON period and a second non-zero RF voltage level in a second ON period. For example only, the second non-zero RF voltage level may be sufficient to generate sufficient plasma to maintain radicals while allowing ion energy to decrease. The second non-zero RF voltage level may be 50% or less of the first non-zero RF voltage level. In this example, the first and second non-zero RF voltage levels may be supplied by same or different RF voltage sources.

As shown in FIG. 5C, the pulsed remote plasma cycle 508 includes alternating between an ON period where two different non-zero RF voltages are supplied and an OFF period where no RF voltage is supplied. In this example, the first and second non-zero RF voltage levels may be supplied by same or different RF voltage sources.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method of performing pulsed remote plasma etching, the method comprising:
arranging a substrate in a processing chamber configured to perform pulsed remote plasma etching;
setting at least one process parameter of the processing chamber;
supplying at least one gas mixture to an upper chamber region of the processing chamber;
supplying, in an ON period, a first voltage to coils arranged around the upper chamber region to energize the at least one gas mixture and generate plasma within the upper chamber region of the processing chamber;
subsequent to supplying the first voltage, supplying, in the ON period, a second voltage to coils arranged around the upper chamber region to energize the at least one gas mixture and generate plasma within the upper chamber region of the processing chamber, wherein the second voltage is fifty percent or less of the first voltage, and the second voltage is configured to generate sufficient plasma to maintain radicals while allowing ion energy to decrease;
subsequent to supplying the second voltage, turning off the first voltage in an OFF period to discontinue generating plasma within the upper chamber region of the processing chamber; and
repeating cycles of supplying the first voltage in the ON period, supplying the second voltage in the ON period, and turning off the first voltage in the OFF period, to generate pulsed remote plasma within the upper chamber region of the processing chamber.

2. The method of claim 1, wherein ion energy distribution is less in the OFF period than in the ON period.

3. The method of claim 1, further comprising setting a duration of the OFF period based on a desired ion energy distribution.

4. The method of claim 1, further comprising setting a duration of the OFF period based on a lifetime of ions associated with the plasma generated within the upper chamber region.

5. The method of claim 4, wherein the duration of the OFF period is greater than the lifetime of the ions.

6. The method of claim 5, wherein the duration of the OFF period is less than a lifetime of radicals associated with the plasma generated within the upper chamber region.

7. The method of claim 6, wherein the duration of the OFF period is between 0.1 ms and 8.0 ms.

8. The method of claim 1, wherein a duty cycle of the ON and OFF periods is between 10% and 90%.

9. A method of performing pulsed remote plasma etching, the method comprising:

arranging a substrate in a processing chamber configured to perform pulsed remote plasma etching;

setting at least one process parameter of the processing chamber;

supplying at least one gas mixture to an upper chamber region of the processing chamber;

supplying, in a first period, a first voltage to coils arranged around the upper chamber region to energize the at least one gas mixture and generate plasma within the upper chamber region of the processing chamber;

supplying, in a second period subsequent to the first period, a second voltage to the coils, wherein the second voltage is fifty percent or less of the first voltage, and the second voltage is configured to generate sufficient plasma to maintain radicals while allowing ion energy to decrease;

turning off the first voltage in a third period subsequent to the second period, to discontinue generating plasma within the upper chamber region of the processing chamber; and repeating cycles of supplying the first voltage, supplying the second voltage, and turning off the first voltage, to generate pulsed remote plasma within the upper chamber region of the processing chamber.

10. The method of claim 9, wherein ion energy distribution is less in the second period than in the first period.

11. The method of claim 9, further comprising setting a duration of the second period based on a lifetime of ions associated with the plasma generated within the upper chamber region.

\* \* \* \* \*